United States Patent [19]

Mullin et al.

[11] Patent Number: 5,687,679
[45] Date of Patent: Nov. 18, 1997

[54] MULTIPLE NANOLAYER COATING SYSTEM

[75] Inventors: Richard S. Mullin, Pomfret Center; William P. Allen, Portland; Maurice L. Gell, Newington, all of Conn.; Richard H. Barkalow, Palm Beach Shores, Fla.; Allan A. Noetzel, Palm Beach Gardens, Fla.; John W. Appleby, Palm Beach Gardens, Fla.; Abdus S. Khan, Palm Beach Gardens, Fla.

[73] Assignee: United Technologies Corporation, Hartford, Conn.

[21] Appl. No.: 657,002

[22] Filed: May 28, 1996

Related U.S. Application Data

[63] Continuation of Ser. No. 321,052, Oct. 5, 1994, abandoned.

[51] Int. Cl.⁶ ........................................................ B32B 18/00
[52] U.S. Cl. ............................ 123/41.79; 123/41.72; 123/41.84; 123/668; 428/216; 428/469; 428/472; 428/699; 428/701; 428/702
[58] Field of Search ............... 123/41.79, 41.72, 123/41.84, 668; 428/216, 469, 472, 699, 701, 762

[56] References Cited

U.S. PATENT DOCUMENTS

| 4,401,697 | 8/1983 | Strangman | 427/250 |
|---|---|---|---|
| 4,643,951 | 2/1987 | Keem | 428/469 |
| 4,844,951 | 7/1989 | Sarin | 427/255 |
| 4,880,614 | 11/1989 | Strangman | 428/623 |
| 5,284,698 | 2/1994 | Marshall et al. | 428/216 |
| 5,302,449 | 4/1994 | Eby et al. | 428/336 |

*Primary Examiner*—Archene Turner
*Attorney, Agent, or Firm*—Charles E. Sohl

[57] ABSTRACT

A thermal barrier coating for high temperature applications has improved resistance to heat flow. The coating comprises a large number of these (nanometer scale) layers separated by interfaces which are effective in retarding heat flow. The coating material will typically be oxide based ceramics and the coating has particular applications in gas turbine engines.

5 Claims, No Drawings

MULTIPLE NANOLAYER COATING SYSTEM

CROSS REFERENCE TO RELATED APPLICATIONS

This is a Continuation Application of prior application Ser. No. 08/321,052 filed on Oct. 5, 1994, now abandoned.

TECHNICAL FIELD

The invention relates to the field of thermally protective coatings and especially to such coatings for use at extreme temperatures.

BACKGROUND OF THE INVENTION

Modern gas turbine engines operate at high temperatures and under conditions which impose large stresses on engine components. Thermodynamic efficiency dictates that operating temperatures be maximized. Increasing temperatures, however, decreases the strength of the metallic engine components. Superalloys are the commonly used materials in high temperature gas turbine applications. Superalloys are alloys based on nickel or cobalt having useful mechanical properties at temperature above about 1,000° F.

Many attempts have been made to develop insulating coatings or thermal barrier coatings which can be used to reduce the effective temperature of the metallic engine components. Ceramic materials are used as insulating materials in thermal barrier coatings.

One style of thermal barrier coatings is applied by plasma spraying. In such a coating there is typically a thin layer, called a bond coat, of a metallic material applied to the substrate, followed by a plasma spray coating of a ceramic material. The metallic bond coat may be applied by various methods including EBPVD (electron beam physical vapor deposition) and plasma spraying. The metallic bond coat composition is selected to maximize the adherence of the plasma sprayed ceramic coating and maximize environmental protection of the substrate in the event of ceramic spallation. Such coatings are typified by U.S. Pat. No. RE 32,121.

Another type of thermal barrier coating consists of a ceramic coating applied by EBPVD (electron beam physical vapor deposition). It is a characteristic of the EBPVD process that fissures or cracks appear in the coating during deposition and these fissures divide the coating into what amounts into a large number of individual ceramic columns. Such coatings are called columnar coatings and because the columns are connected only to the substrate and not to each other, the metallic substrate can expand and contract within reasonable limits without causing coating or spallation. Typical of this type of coating is that described in U.S. Pat. No. 4,405,659.

The typical thickness of the ceramic thermal barrier coating would range from 10 mils to 50 mils (250 microns to 1250 microns), thicker coatings produce increased thermal barrier effects.

In gas turbine thermal barrier coatings, there is a significant distinction between coatings for rotating parts and coatings for stationary parts. Rotating parts experience unique stresses as a consequence of thermal expansion, and gas pressures and centrifugal forces. Stationary components undergo stresses resulting from thermal expansion and pressures of the gases flowing through the engine.

The stresses on the rotating parts are much greater than the stresses on the stationary parts and the stresses on the rotating parts increase as the weight of the parts increases and as the rotational speed increases. High rotational speeds are desired for maximum engine performance. For this reason, despite the many speculative comments in the patents and technical literature, ceramic thermal barrier coatings have generally not been used on rotating gas turbine engine components. The reason for this is that the extra weight required for a ceramic thermal barrier coating to have sufficient thickness to provide an effective thermal barrier effect is sufficient to substantially increase the stresses on the rotating gas turbine engine components. Because of these stresses, the prior art ceramic thermal barrier coatings have not been practical for use on rotating gas turbine engine components.

One exception has been the use of small areas of ceramic thermal barrier components to blade root platforms. Blade root platforms are located on the blade root which is the thickest portion of the blade because the blade root is near the axis of rotation the centrifugal forces are more easily accommodated in the root than they are at the blade tip of the blade. Consequently, in this limited application thermal barrier coatings have been used with some success.

Another factor which enters into the background of the present invention is the development of improved superalloys which have greater oxidation resistance than the superalloys used in the past. In the recent past, (1960—present) superalloys were invariably coated with overlay or diffusion aluminide coatings to protect them against oxidation and corrosion. Prior to about 1960 operating temperatures were so low that protective coatings were not commonly used. There are current superalloys which have sufficient inherent oxidation and corrosion resistance to operate without such protective coatings. A feature of such modern generation superalloys is that they oxidize in a limited, controlled fashion and that the oxide produced is adherent and serves to reduce (and essentially eliminate) subsequent oxidation. This characteristic of oxide adherence makes the alloys uniquely adapted to have ceramic thermal barrier coatings applied directly to their surfaces without an intermediate bond coat.

DISCLOSURE OF INVENTION

The invention is substantially different from the prior art thermal barrier coatings. The invention in its basic form comprises many thin layers of ceramic applied to the superalloy substrate by an evaporation process. Usually there will be alternating layers of different ceramics applied to the substrate. The layers are separated by distinct interfaces or boundaries. These interfaces are a key feature of the invention.

For example, an exemplary coating according to the present invention consists of alternating layers of yttria stabilized zirconia (in nanocrystalline form), and alumina with each layer being only about 1,000 angstroms thick. When about 50 of such alternating layers are applied to an appropriate superalloy substrate a coating having a total thickness of between 4 microns to 5 microns results. Surprisingly, this coating exhibits only about half of the heat conduction which would be expected (by the rule of mixtures) based on the thermal conductivity properties of thick layers of yttria stabilized zirconia and alumina.

We attribute the improved resistance to thermal conduction to phonon scattering occurring at the interfaces between the first ceramic layer and substrate, at the interfaces between the alternating ceramic layers, at the grain boundaries within the nanocrystalline yttria stabilized zirconia, and within the alumina material which is itself more glassy or amorphous in nature than crystalline, and thus less able to transmit phonon vibrations.

It is generally believed that thermal conduction in metals occurs through the transfer and motion of the electrons but that such electron motion is not a major factor in the conduction of heat in insulating materials such as ceramics. In ceramic materials, heat transfer is believed to occur by phonon motion where phonons are a type of lattice vibration. Being lattice-vibration based, phonon heat conduction occurs best in crystalline materials which have distinct (and relatively regular) crystal lattices as opposed to glass or amorphous materials in which atomic arrangement is more random than regular. Phonon vibration is also impeded by grain boundaries.

Turning now to the basics of what we believe to be our invention: we require a multiplicity of adjacent layers (each of which is adhered to its neighbors) separated by a physical interface or boundary equivalent to what those skilled in the art term a high angle grain boundary. In reality it is the boundaries that apparently produce the beneficial thermal barrier results observed in the present invention. The differences between the layers which are helpful in producing such a high-angle type of grain boundary include the following:

1. a difference in crystal type between the layers (for example, one layer having a hexagonal structure and the adjacent layer having a cubic structure; or one layer having an amorphous structure and the adjacent layer having a crystalline structure),
2. crystal structures of the same type which have substantially different lattice perimeters (a greater than 10% difference in lattice parameters), or
3. crystal structures having the same type and similar lattice parameters but having radically different orientations (for example a 100 crystal orientation in one layer and a 111 orientation in the adjacent layer).
4. We also believe that there are circumstances in which effective, stable interfaces could be created between identical materials (for example in sputtering processes, an interruption in the sputtering current will produce a visible interface even though the interface separates two identical layers).

Any one or more of these three factors may be sufficient to produce the requisite high-angle grain boundary structure. At the moment, we believe that different crystal types are the most straightforward way to create such boundaries but we do not exclude the possibility that the other latter two factors, different perimeters and different orientations might be significant in producing thermal barrier coatings which are effective according to the present invention.

We have a clear preference that at least some of the layers be amorphous because we believe that amorphous layers contribute greatly to reduced heat conduction. We prefer that at least 20% of the layers have a predominantly amorphous crystal structure and we most prefer that at least 40% of the layers have a amorphous structure.

While in the limit only two layers separated by a high-angle boundary structure, would theoretically exhibit the reduced heat transfer which is characteristic to the present invention, such a thin coating would have little or no practical use. We prefer therefore, that to have at least ten layers of alternating materials with each layer being separated from adjoining layers by high angle grain boundary structure and we most prefer to have at least 50 layers in the coating. There is no upper limit on the number of layers except for total coating thickness and the cost of coating application.

Broadly, each layer may range in thickness from about 10 angstroms (1 nm) to about 10,000 angstroms (1,000 nm); and preferably each layer will range in thickness from about 50 angstroms (15 nm) to about 5,000 angstroms (500 nm).

For coatings to be useful in gas turbine engine applications, a coating thickness of at least 1 mil (25 microns) is required and preferably at least 3 mils (75 microns) is required. For rotating components where coating weight is a critical factor, we prefer a maximum coating thickness of about 10 mils (250 microns) and most prefer about 5 mils (125 microns) maximum thickness. For stationary components, where weight is of less concern, there is no practical upper limit but generally coatings will not exceed about 12 mils (300 microns) in thickness.

We have identified three ceramic materials which appear to be ideally suited for use in coatings according to the present invention. These ceramic materials are alumina ($Al_2O_3$), stabilized zirconia, [preferably yttria stabilized zirconia ($ZrO_2$ plus $Y_2O_3$)], and ceria ($CeO_2$). We have done most of our work with the first two materials, alumina and yttria stabilized zirconia.

These three materials share the common attribute in that they all have a relatively high co-efficient of thermal expansion which makes them more suitable for application to metallic substrates than other ceramic materials which have lower co-efficients of thermal expansion.

In terms of inherent bulk thermal conductivity, alumina has the highest conductivity and ceria has the lowest conductivity while zirconia has an intermediate conductivity. In terms of oxygen permeability, yttria stabilized zirconia has the highest oxygen permeability, ceria has an intermediate oxygen permeability, and alumina has a low oxygen permeability. In general, a low oxygen permeability is desired since the coating will then tend to protect the underlying metallic substrate from oxidation by atmospheric oxygen which diffuses through the coating. In terms of hardness, alumina has the highest hardness, zirconia has an intermediate hardness and ceria has the lowest hardness. A high value of hardness is generally preferred because of problems with particle erosion which can occur in certain gas turbine applications.

As previously mentioned, alumina can be processed to have an amorphous characteristic while yttria stabilized zirconia and ceria are both generally crystalline materials. Consequently, it is desirable to have a significant number of the layers be alumina. Alumina is preferred as the initial layer adjacent to the substrate; because the native oxide which forms on the substrate due to oxidation of the substrate will be alumina and it is felt that having an alumina layer in the coating adjacent to a naturally occurring alumina layer will probably provide the best coating adherence. There is also a desire to have one or more alumina layers as the outer layers in the coating to provide erosion resistance, also, outer layers of alumina will reduce oxygen diffusion.

In terms of crystal structure, alumina has a characteristic hexagonal structure, meaning that if it were deposited under conditions which encouraged the formation of a crystalline structure, that structure would be hexagonal. Under most deposition conditions alumina has a tendency to be amorphous. The stabilized zirconia is a mixture of cubic and tetragonal lattices wherein the yttria tends to stabilize the cubic structure and sufficient yttria contents (more than about 20% by weight) will produce a fully stable structure. Ceria has a cubic lattice structure.

A major attribute of these three ceramic materials is that they are essentially inert and resistant to interdiffusion with each other and this leads to stability during exposure to elevated temperatures for long periods of time, thus preserving the sharp interface which seems to be required for good thermal barrier performance.

The alumina material tends to form an amorphous structure when it is vapor deposited onto a substrate which is held at a relatively low temperature ($\leq 2000°$ F.) and in the alternative it tends to form a crystalline structure when applied by a vapor deposition to a substrate held at a relatively high temperature ($\geq 2,000°$ F.). The yttria stabilized zirconia may be either partially or fully stabilized. We have used partially stabilized yttria stabilized zirconia containing between 6 to 8 weight percent yttria because this is the material we currently use in plasma sprayed ceramic thermal barrier coatings and we have experience with its use and properties. However, up to about 30% yttria may be used to stabilize the zirconia in which case the zirconia will be wholly stabilized and will not undergo any crystalline transformations with temperature changes. Other materials such as cerium oxide, magnesium oxide, calcium oxide, and scandium oxide may also be used to stabilize zirconia.

We have applied the layers in the experimental coatings to date using sputtering, reactive sputtering, and electron beam vapor deposition but we also believe that other physical vapor deposition techniques including physical vapor deposition and chemical vapor deposition. We prefer physical vapor deposition processes, because of the high rate of deposition compared with other processes. In particular, EBPVP, sputtering, laser ablation and cathodic arc deposition might be used.

We prefer to have as sharp a compositional gradient as possible at the interface boundaries since we believe this maximizes the boundary phonon scattering effect and decreases the effective thermal conductivity of the resultant coating. Using electron beam physical vapor deposition, we have applied our layers by rotating the part to be coated above two ceramic materials mechanically separated within a crucible, for example one area of alumina and one of yttria stabilized zirconia, and using an electron beam to vaporize first one of the areas then switching the beam to vaporize the other area. Because of the steepness of the slope of vapor pressure of ceramics as a function of temperature, the effective vapor pressure of one of the ceramic species drops dramatically as soon as the beam is switched away from one area to the other area and this means that there is very little grading of the inter layers in the resultant coatings. Using the sputtering process, alternating layers of ceramic were deposited by applying electrical current to independent sputter targets within the coating chamber. One target was yttria stabilized zirconia and the second target was alumina. The thickness of the deposited layer is proportional to the duration and density of applied current. The maintenance of sharp boundaries, even after long exposures at elevated temperatures, is encouraged with either process by the use of materials having low mutual solid solubilities.

The invention coating has been found to have other beneficial attributes. For example, in gas turbine engine components, fatigue damage from vibration is often a problem. The fatigue damage is effected by the vibrational modes exhibited by the article and these vibrational modes can be affected by surface coatings. We have found that the invention coating has no observable effect on the vibrational modes of the gas turbine engine components which we have investigated and this is desirable since it simplifies the calculation and analysis of vibrational modes and reduces the problems which would otherwise be encountered if the vibrational modes were to change as a function of coating thickness. Fatigue is also affected by residual surface stresses and we have not observed any detrimental residual stresses in the practice of the present invention.

The invention coating will commonly be applied to air cooled gas turbine superalloy components which have internal cooling passages connected to the component surface by many small cooling holes to allow air to flow from the internal passages to the surface of the part. Air flow over the surface of the part provides a protective air cooling film which prevents the hot engine gases from directly contacting the component surface. Whereas other thermal barrier coating techniques and other thermal barrier coating types tend to plug up these cooling passages and interfere with the air cooling flow, the present invention coatings have not been found to have any significant effect on airflow. This is a significant economic benefit.

Thus, the thermal barrier coating of the present invention appears to fulfill the fundamental characteristics required of an effective thermal barrier coating for rotating gas turbine engine hardware, which are: 1. low thermal conductivity, 2. chemical and structural stability at elevated temperatures for long periods of time, (i.e., lack of interdiffusion) 3. adherence, and 4. practical and economical applicability to complex air cooled components.

BEST MODE FOR CARRYING OUT THE INVENTION

EXAMPLE I

SPUTTERING

Superalloy test parts having a nominal composition (by weight) 5% Cr, 10% Co, 1.9% Mo, 5.9% w, 3.0% Re, 8.7% Ta, 5.65% Al, 0.10% Ht bal essentially Ni were cleaned and then coated with a layered coating comprising alternate layers of yttria stabilized zirconia (6.8% yttria) and alumina. Each layer was approximately 1,000 angstroms thick. The layered structure was examined by transmission electron microscopy and scanning electron microscopy and the interfaces were found to be sharp and distinct.

These layers were applied by rotating the test samples in a vacuum chamber in front of two sputtering targets one of yttria stabilized zirconia and one of alumina. About 50 layers were applied.

The coated parts were then tested for thermal conductivity using the 3-omega method developed by Cahill and described in D. G. Cahill et al Phys. Rev. B. vol. 35 pg. 4067 1987. This method consists of depositing a thin metal line (platinum or gold, 3000 angstroms thick and 25 microns wide) on the surface of a coated sample using photolithography. Frequency dependent self-heating of the metal line, which acts as both heater and thermometer, is used to measure the thermal conductivity. One advantage of this technique is that the thermal conductivity of the coating can be measured with no prior knowledge of other coating thermal properties (e.g., heat capacity). The measured thermal conductivity of the laminated coating produced according to the present invention is only about one-half of the thermal conductivity calculated for a simple mixture of yttria stabilized zirconia and alumina using the rule of mixtures.

EXAMPLE II

EBPVD

Superalloy test parts having a composition as described above were coated using the electron beam physical vapor deposition process with a layered or laminated coating comprising alternate layers of yttria stabilized zirconia (6% to 8% yttria) and alumina. Each yttria stabilized zirconia layer was approximately 1,000 nanometers thick and each alternating layer of alumina was approximately 50 nanometers thick. Metalloyraphic examination through the coating thickness showed clear lines of demarcation between layers, strongly suggesting that they were separated by high angle boundaries.

These layers were applied by rotating the test samples in a vacuum chamber over two crucibles, one being yttria stabilized zirconia (8% yttria) and one being of alumina. A high-powered electron beam was caused to scan over the surface of the ceramic materials in an alternate fashion to cause alternating evaporation of the two ceramic material and condensation upon the nearby test bar. Approximately 100 layers were applied to the test bar to provide a total coating thickness of about 4 mils (100 microns).

EXAMPLE III

In another confirmation of the present invention, severed gas turbine blades were coated in the fashion described above with respect to the sample test parts. These blades were then run in an advanced gas turbine engine simulator known as the ATEGG (Advanced Turbine Engine Gas Generator). This is a severe test since this ATEGG engine is intended to develop future gas turbine engine designs. The blades ran for 38.4 hours in this engine including 7 minutes at a temperature of 106° F. above the intended engine operating temperature. At the conclusion of our test, the blades were examined and exhibited no signs of deterioration where as nonthermal barrier coated blades exhibited oxidation attack at the leading edge of the airfoil. This confirms the merit of the present invention and the suitability of the present invention to protect advanced gas turbine engine hardware.

Although this invention has been shown and described with respect to detailed embodiments thereof, it will be understood by those skilled in the art that various changes, omissions and additions in form and detail thereof may be made without departing from the spirit and scope of the claimed invention.

We claim:

1. An air cooled gas turbine component which comprises:

a. a superalloy substrate having internal cooling passages for the flow of cooling air, b. a thermal barrier coating on said substrate, comprising: at least 10 layers of ceramic, each layer being from about 10 angstroms to 10,000 angstroms in thickness, each layer being separated from adjacent layers by a stable interface with the total thickness of the coating being at least 1 mil (25 microns).

2. A component as in claim 1 wherein at least 50% of the layers are based on a material selected from the group consisting of alumina, ceria, and zirconia.

3. A component as in claim 1 wherein at least 20% of the layers have a microstructure which is partially amorphous.

4. A component as in claim 1 wherein the substrate is one which contains sufficient aluminum so that it forms an alumina layer upon exposure to oxygen at elevated temperatures.

5. A component as in claim 1 having at least 10 boundaries separating thin ceramic layers.

* * * * *